United States Patent [19]

Takemae

[11] Patent Number: 4,982,366
[45] Date of Patent: Jan. 1, 1991

[54] STATIC SEMICONDUCTOR MEMORY WITH READOUT INHIBIT MEANS

[75] Inventor: Yoshihiro Takemae, Tokyo, Japan
[73] Assignee: Fujitsu Limited, Kawasaki, Japan
[21] Appl. No.: 467,348
[22] Filed: Jan. 22, 1990

Related U.S. Application Data

[63] Continuation of Ser. No. 342,654, Apr. 24, 1989, abandoned, which is a continuation of Ser. No. 231,612, Aug. 11, 1988, abandoned, which is a continuation of Ser. No. 40,753, Apr. 15, 1987, abandoned, which is a continuation of Ser. No. 896,325, Aug. 18, 1986, abandoned, which is a continuation of Ser. No. 530,473, Sep. 8, 1983, abandoned.

[30] Foreign Application Priority Data

Sep. 17, 1982 [JP] Japan .............................. 57-161694

[51] Int. Cl.⁵ .......................................... G11C 11/413
[52] U.S. Cl. ................................ 365/195; 365/189.05; 365/233.5; 365/189.07
[58] Field of Search ................. 365/189.05, 189.07, 365/194, 195, 196, 230.08, 233.5; 371/69, 71

[56] References Cited

U.S. PATENT DOCUMENTS

| | | | |
|---|---|---|---|
| 4,272,832 | 6/1981 | Ito | 365/189 |
| 4,480,321 | 10/1984 | Aoyama | 365/230 |
| 4,486,883 | 12/1984 | Kanai et al. | 371/67 |
| 4,573,147 | 2/1986 | Aoyama et al. | 365/230 |

FOREIGN PATENT DOCUMENTS 0008988  1/1982  Japan ................................ 365/233.5

OTHER PUBLICATIONS

Mackie et al., "Echo Check Circuit", IBM Technical Disclosure Bulletin, vol. 11, No. 2, July, 1968, pp. 197–198.
Burke, "Diagnostic Mode", IBM Technical Disclosure Bulletin, vol. 13, No. 3, Aug., 1970, pp. 655–656.

*Primary Examiner*—Glenn Gossage
*Attorney, Agent, or Firm*—Staas & Halsey

[57] ABSTRACT

A static semiconductor memory device includes a memory cell array including a large number of static memory cells arranged in a matrix fashion, a word decoder, a column decoder, and a data buffer. An address delay buffer is provided for delaying an input address signal by a predetermined delay time and a comparator circuit is provided for comparing the input address signal with the delayed address signal from the address delay buffer, so that even if the input address signal is disturbed by noise, the erroneous data corresponding to the disturbed address signal is not read into the data buffer by means of the output signal of the comparator circuit and is not output from the memory device.

3 Claims, 7 Drawing Sheets

STATIC SEMICONDUCTOR MEMORY WITH READOUT INHIBIT MEANS

This is a continuation of co-pending application(s) Ser. No. 07/342,654 filed on Apr. 24, 1989, now abandoned which is a continuation of Ser. No. 07/231,612, filed Aug. 11, 1988, abondoned; which is a continuation of Ser. No. 07/040,753, filed Apr. 15, 1987, abandoned; which is continuation of Ser. No. 06/896,325, filed Aug. 18, 1986, abandoned; and which is a continuation of Ser. No. 06/530,473, filed Sept. 8, 1983, also abandoned.

BACKGROUND OF THE INVENTION

1. Field of the Invention

The present invention relates to a static semiconductor memory device, more particularly to a static semiconductor memory device prevented from outputting erroneous data due to noise when reading the address signals.

2. Description of the Prior Art

In a dynamic semiconductor memory device, an external address signal for reading out data is latched by the change of a clock signal. Since the address signal has been latched in the memory device, the reading operation will not be disturbed by subsequent noise.

A static semiconductor memory device, however, usually does not use a clock signal to latch an external address signal. Accordingly, in prior art static semiconductor memory devices, if an external address signal is disturbed by noise, the disturbed address signal is directly introduced into the internal circuit. Further, since the reading operation is effected at a high speed, completely erroneous data from the address may be read out from the memory device.

SUMMARY OF THE INVENTION

The object of the present invention is to provide a static semiconductor memory device in which even if the address signal for reading is changed by noise, erroneous data corresponding to the changed address is prevented from being output externally from the memory device.

In accordance with the present invention, there is provided a static semiconductor memory device comprising; a memory cell array including a large number of static memory cells arranged in a matrix fashion; a word decoder for selecting one word line by decoding an input address signal; a column decoder for selecting one bit line by decoding the input address signal; a data buffer for storing data read out from the memory cell array; an address delay buffer for delaying the input address signal by a predetermined delay time; and a comparator circuit for comparing the input address signal with the delayed address signal from the address delay buffer. The data buffer includes means for inhibiting it from storing data read out from the memory cell array in response to an inequality signal from the comparator circuit.

DESCRIPTION OF THE PREFERRED EMBODIMENTS

Before describing the preferred embodiment of the present invention, a prior art static semiconductor memory device is described for purpose of comparison, referring to the drawings.

Figure 1:
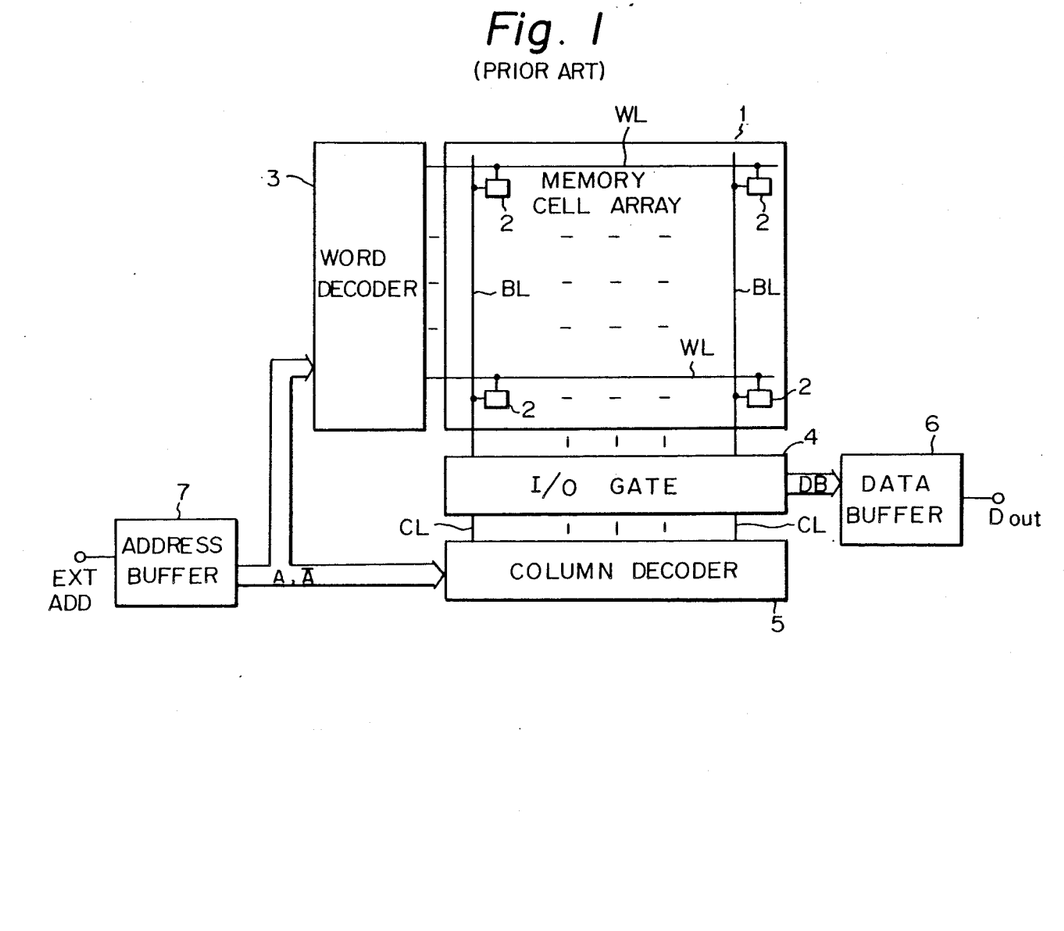
FIG. 1 is a block diagram of a prior art static semiconductor memory device.

FIG. 1 is a prior art semiconductor memory device. The memory device of FIG. 1 comprises a memory cell array 1 including a large number of static memory cells 2 arranged in a matrix fashion, a word decoder 3 for selecting one word line WL, an input-output gate 4 coupled to bit lines BL, a column decoder 5 for supplying the input-output gate 4 with a bit line selecting signal through the column lines CL, a data buffer 6 for outputting the data read out from the input-output gate 4 onto the data bus DB to the outside, and an address buffer 7 for receiving an input address signal ADD supplied from the outside and for supplying an inner address signal A and its inverted signal $\bar{A}$ to the word decoder 3 and the column decoder 5.

Figure 2:
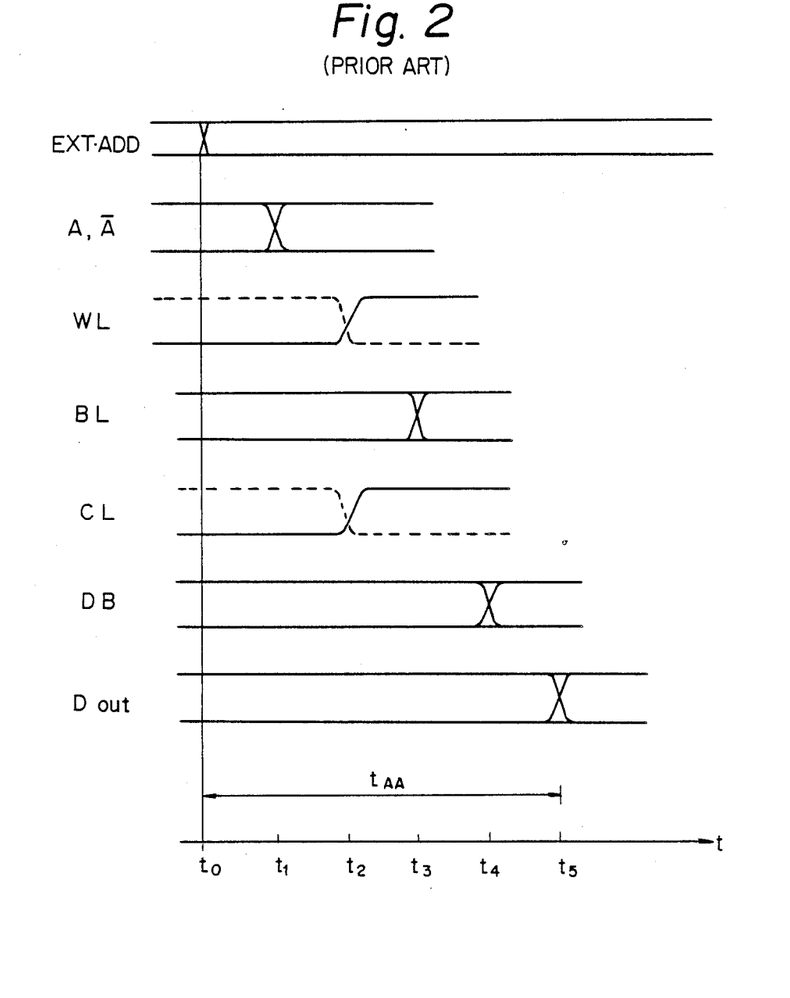
FIG. 2 is a time chart of a normal reading operation in the memory device of FIG. 1.

A timing chart of the normal operation of the memory device of FIG. 1 is given in FIG. 2. Assume that the address signal ADD is changed at the time $t_0$. The inner address signal A ($\bar{A}$) is then changed at the time $t_1$, and the reading operation for the new address is started. The word line WL and the column line CL corresponding to the new address are selected at the time $t_2$. The new data from the cell selected by the new word line is output on a bit line BL at the time $t_3$, and the data corresponding to the new address is output on the data bus DB at the time $t_4$. The output $D_{out}$ of the data buffer 6 is changed to the data corresponding to the new address at the time $t_5$. Thus, the access time for reading of this memory device is $t_{AA}$.

Figure 3:
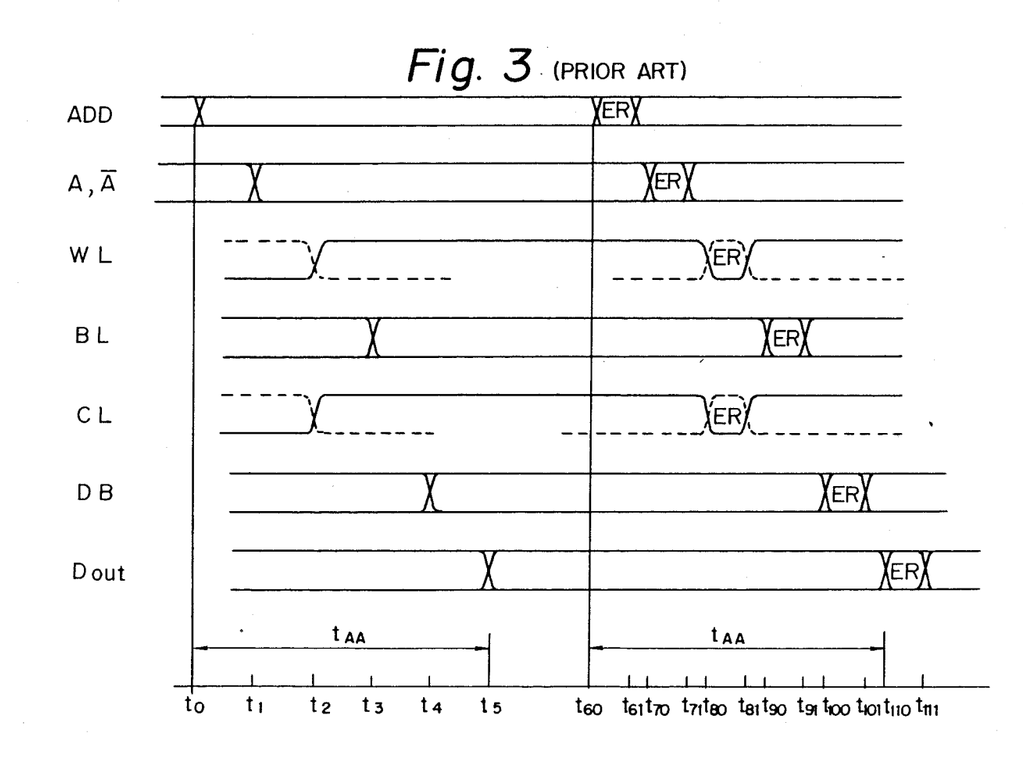
FIG. 3 is a time chart of an erroneous reading operation in the memory device of FIG. 1.

In the static semiconductor memory device of FIG. 1, since the operation speed of the static memory device is high, the output data may be influenced by transient noise applied to the address signal. A timing chart of an erroneous operation due to transient noise in the memory device of FIG. 1 is given in FIG. 3. The input address signal ADD is normally changed at the times $t_0$ and $t_0'$ (after $t_{110}$). Before $t_0'$, however, it is transiently changed by error by noise between, for example, the times $t_{60}$ and $t_{61}$. Accordingly, the inner address signal A ($\bar{A}$) is changed erroneously between the times $t_{70}$ and $t_{71}$, the word line WL and the column line CL corresponding to the erroneous address are selected erroneously between the times $t_{80}$ and $t_{81}$, the erroneous data from the cell corresponding to the erroneous address is output on a bit line BL between the times $t_{90}$ and $t_{91}$, the data from the memory cell corresponding to the erroneous address is read out onto the data bus DB between the times $t_{100}$ and $t_{101}$, and the erroneous output data $D_{out}'$ is output from the data buffer between the times $t_{110}$ and $t_{111}$. That is, the output data $D_{out}$ is changed erroneously at the time $t_{110}$, which is later than the time $t_{60}$ by the above-mentioned access time $t_{AA}$. The output data $D_{out}$ returns to normal at the time $T_{111}$. Accordingly, in the prior art static semiconductor memory device of FIG. 1, noise may cause erroneous data to be output. This data may erroneously be used as the read-out data.

Figure 4:
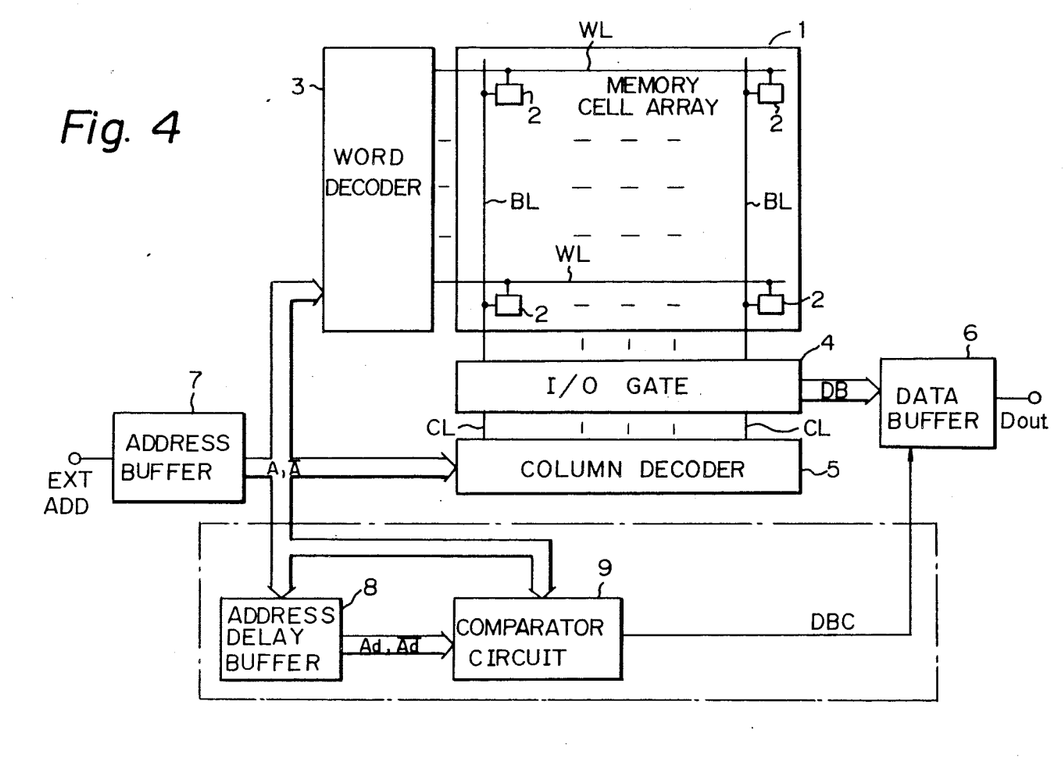
FIG. 4 is a block diagram of a static semiconductor memory device in accordance with one embodiment of the present invention.

A static semiconductor memory device in accordance with one embodiment of the present invention will now be described with reference to the drawings. FIG. 4 is a block diagram of this semiconductor memory device. In FIG. 4, portions corresponding to those in FIG. 1 bear the same reference numerals. The memory device of FIG. 4 further comprises an address delay buffer 8 and a comparator circuit 9.

Figure 5:
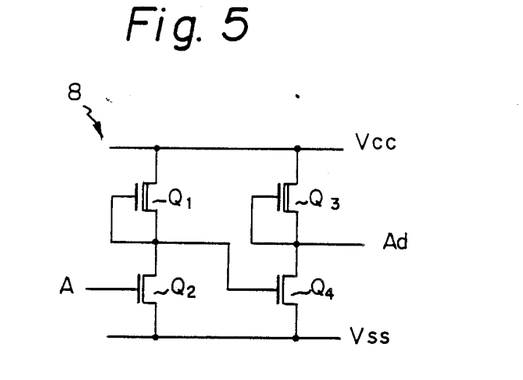
FIG. 5 is a circuit diagram of one example of the address delay buffer in the memory device of FIG. 4.

The address delay buffer 8 produces address signals Ad and ($\overline{Ad}$) which are delayed by a predetermined time from the inner address signals A ($\overline{A}$). An example of the circuit structure of the address delay buffer 8 is illustrated in FIG. 5. In the circuit of FIG. 5, transistors $Q_1$ and $Q_2$ form a first stage inverter, and transistors $Q_3$ and $Q_4$ form a second stage inverter. The transistors $Q_1$ and $Q_3$ are depletion-type field-effect transistors (FET's). The inner address signal A is delayed by these two stage inverters which output a delayed address signal Ad. The inverted inner address signal $\overline{A}$ is delayed by the same circuit to obtain a delayed inverted address signal $\overline{Ad}$. The number of stages of inverters may be increased in accordance with the required delay time $t_D$.

Figure 6:
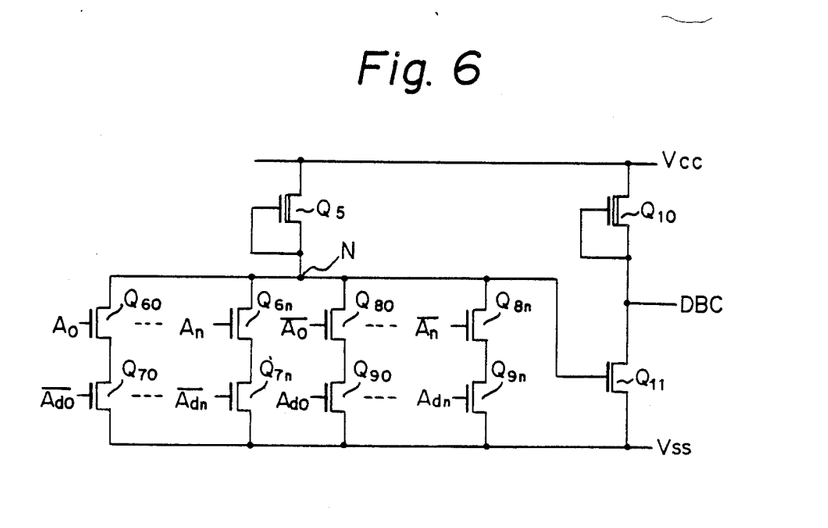
FIG. 6 is a circuit diagram of one example of the comparator device of FIG. 4.

The comparator circuit 9 of FIG. 4 compares the inner address signals A, ($\overline{A}$) with the delayed address signal Ad, ($\overline{Ad}$) to produce a data buffer control signal DBC for making the data buffer 6 operable only when the inner address signal A ($\overline{A}$) and the delayed address signals Ad, ($\overline{Ad}$) are equal to each other. An example of the structure of the comparator circuit 9 is illustrated in FIG. 6. The circuit of FIG. 6 comprises transistors $Q_5$ through $Q_{11}$. The transistors $Q_5$ and $Q_{10}$ are depletion-type FET's. The transistor pairs $Q_{60}$ and $Q_{70}$, $Q_{6n}$ and $Q_{7n}$, $Q_{80}$ and $Q_{90}$, and $Q_{8n}$ and $Q_{9n}$ are each connected in series between the source of the transistor $Q_5$ and the ground $V_{SS}$. The bits $A_0$, —, $A_n$ of the inner address signal A are applied to the gates of the transistors $Q_{60}$, — $Q_{6n}$; the bits $\overline{Ad}_0$, — $\overline{Ad}_n$ of the delayed inverted address signal $\overline{Ad}$ are applied to the gates of the transistors $Q_{70}$, — $Q_{7n}$; the bits $\overline{A}_0$, — $\overline{A}_n$ of the inverted address $\overline{A}$ are applied to the gates of the transistors $Q_{80}$, — $Q_{8n}$; and the bits $Ad_0$, — $Ad_n$ of the delayed address Ad are applied to the gates of the transistors $Q_{90}$, — $Q_{9n}$.

In the comparator circuit 9 of FIG. 6, when the inner address signal A ($\overline{A}$) and the delayed address signal Ad ($\overline{Ad}$) are equal to each other in all bits (that is, $Ai = Adi$ and $\overline{Ai} = \overline{Adi}$), one transistor in each of the series-connected circuits $Q_{60}$ and $Q_{70}$, —, $Q_{6n}$ and $Q_{7n}$, $Q_{80}$ and $Q_{90}$, —, $Q_{8n}$ and $Q_{9n}$ turns off. Thus, all these series-connected circuits turn off. Accordingly, the level of the node N (the source of the transistor $Q_5$) becomes the "H" level, the transistor $Q_{11}$ turns on, and the output DBC becomes the "L" level. On the other hand, when the inner address signal A ($\overline{A}$) and the delayed address signal Ad ($\overline{Ad}$) are not equal to each other in even one bit (for example $A_0 \neq Ad_0$), two transistors in one of the series-connected circuits remain on, and the node N becomes the "L" level. For example, if $A_0 = \overline{Ad}_0 = $ "H", then the transistors $Q_{60}$ and $Q_{70}$ are both on. If $A_0 = \overline{Ad}_0 = $ "L", then $\overline{A}_0 = Ad_0 = $ "H" and the transistors $Q_{80}$ and $Q_{90}$ are both on. In this case, the output DBC of the comparator becomes the "H" level.

Figure 7:
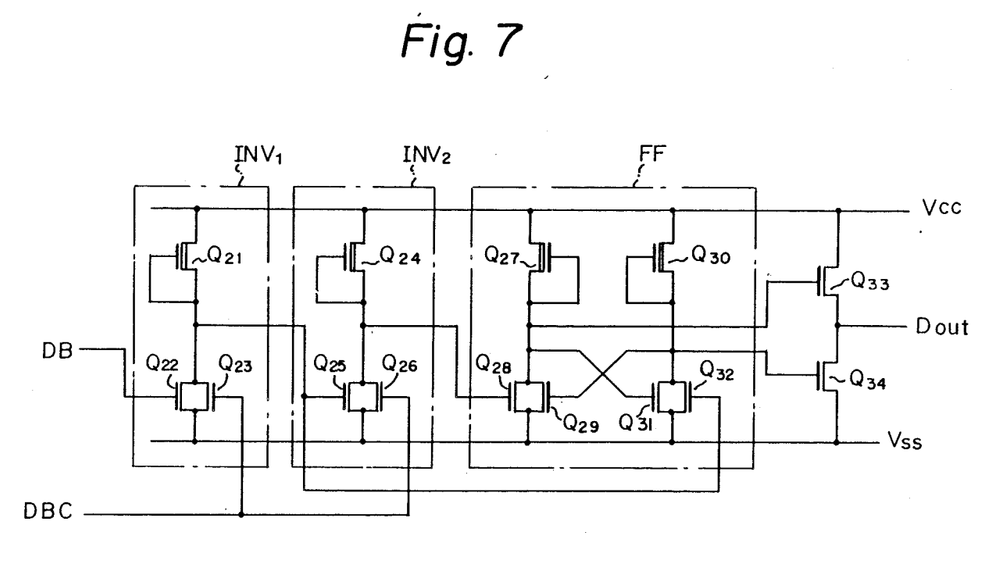
FIG. 7 is a circuit diagram of one example of the data buffer in the memory device of FIG. 4.

An example of the structure of the data buffer 6 in FIG. 4, which is controlled by the control signal DBC, is illustrated in FIG. 7. In FIG. 7, transistors $Q_{21}$ and $Q_{22}$ form a first-stage inverter $INV_1$. The transistors $Q_{24}$ and $Q_{25}$ form a second stage inverter $INV_2$ which inverts the output of the first-stage inverter $INV_1$. The transistor $Q_{23}$ is connected in parallel with the transistor $Q_{22}$, and a transistor $Q_{26}$ is connected in parallel with the transistor $Q_{25}$. The control signal DBC is applied to the gates of the transistors $Q_{23}$ and $Q_{26}$. When the control signal DBC is "H", the data reading operation of the data buffer 6 is inhibited. The transistors $Q_{27}$ through $Q_{32}$ form a flip-flop circuit FF. The outputs of the inverters $INV_1$ and $INV_2$ set or reset the flip-flop circuit FF in accordance with the level of the data on the data bus DB.

When the control signal DBC is the "L" level, the output of the flip-flop circuit FF turns output-stage transistors $Q_{33}$ and $Q_{34}$ on and off. The output data $D_{out}$ read out from the memory device is produced by the output-stage transistors $Q_{33}$ and $Q_{34}$.

When the control signal DBC is the "H" level, the transistors $Q_{23}$ and $Q_{26}$ become on, and the outputs of the inverters $INV_1$ and $INV_2$ become the "L" level, regardless of the input data. In this case, the transistors $Q_{28}$ and $Q_{32}$ in the flip-flop circuit FF become off, and the output of the flip-flop circuit FF is kept to the preceding value.

In the static semiconductor memory device of FIG. 4, the reading operation of the data buffer 6 is inhibited when erroneous data due to noise is output from the input-output gate circuit 5 on the data bus DB, so that this erroneous data does not appear in the output data $D_{out}$.

Figure 8:
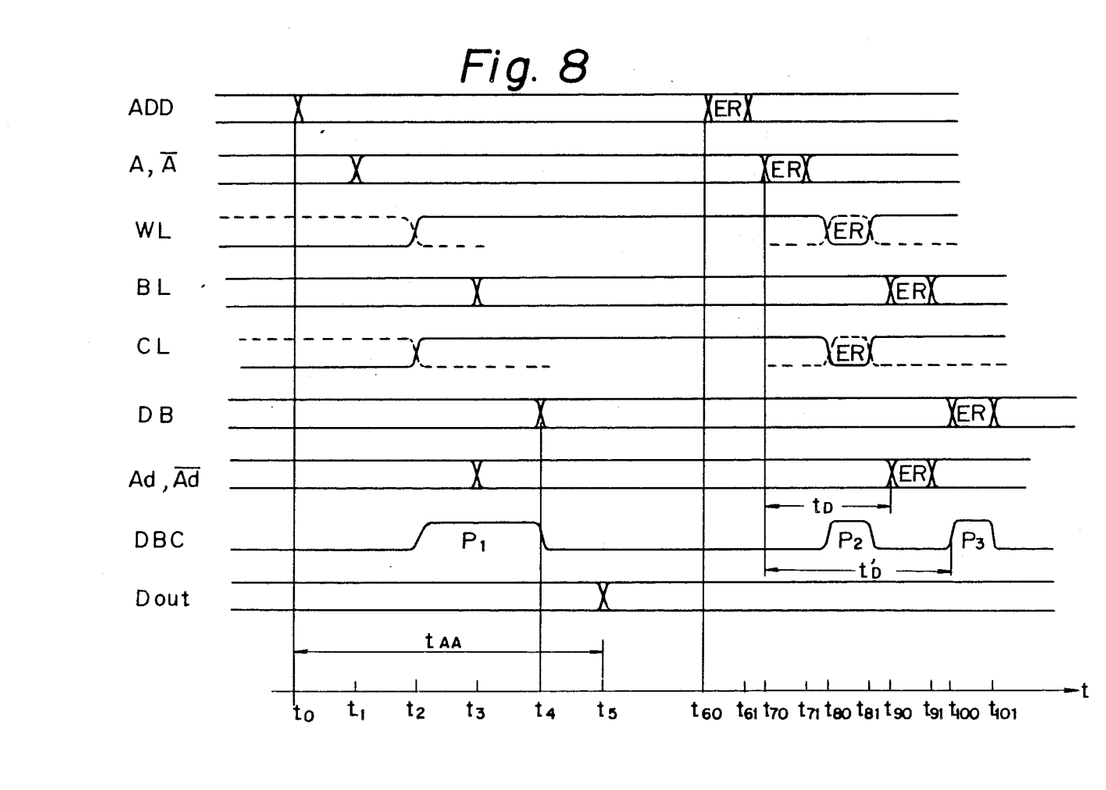
FIG. 8 is a time chart of a reading operation of the memory device of FIG. 4.

FIG. 8 is a time chart of the reading operation of the memory device of FIG. 4. In FIG. 8, the external address signal ADD is changed at the time $t_0$ and is disturbed by noise between the times $t_{60}$ and $t_{61}$, as in FIG. 3. The changes in the inner address signal A ($\overline{A}$), the selection of the word line WL, the column line CL, and the bit line BL, and the data bus output DB are the same as those in FIG. 3. The delayed address signal Ad ($\overline{Ad}$), corresponding to the inner address signal A ($\overline{A}$) and changed at the time $t_1$ is produced by the address delay buffer 8 at a time later than the time $t_1$ by the delay time $t_D$. A delayed address signal Ad ($\overline{Ad}$) corresponding to the erroneous inner address signal A ($\overline{A}$) results from the noise produced after a delay time $t_D$. The data buffer control signal DBC from the comparator circuit 9 becomes the "H" level during the periods $P_1$, $P_2$, and $P_3$. The delay time $t_D$ is adjusted in the address delay buffer 8 so that the third period $P_3$ coincides with the period between the times $t_{100}$ and $t_{101}$ in which the erroneous data resulting from the noise is output from the input-output gate circuit 4 onto the data bus DB. This adjustment of the delay time $t_D$ is determined by considering the delay from the change of the address to the change of the output data, the operation delay in the comparator circuit 9, etc.

Since the reading operation of the data buffer 6 is inhibited during the period in which the erroneous data resulting from the noise is output on the data bus DB, as described above, the erroneous data is not read into the data buffer 6, and the data buffer 6 continues to output the normal data in the corresponding period.

In FIG. 8, though the data buffer control signal DBC becomes the "H" during level in the periods $P_1$ and $P_2$ along with the period $P_3$, it does not influence the reading operation of the memory device of FIG. 4, as described below. As the period $P_1$ is finished at the time $t_4$ and as the data corresponding to the address changes at the time $t_0$ and is output onto the data bus at the time $t_4$, this data is read into the data buffer 6, and the output data $D_{out}$ is changed at the time $t_5$. Thus, the access time for reading data into the memory device of FIG. 4 is $t_{AA}$, just as in the memory device of FIG. 1. Besides, since the normal data is read into the data buffer 6 before the period $P_2$, even if the reading operation of the data buffer 6 is inhibited during the period $P_2$, the data buffer 6 continues to output normal data.

As described above, in the static semiconductor memory device according to the present invention, even if the address signal for reading is disturbed by noise, the erroneous data due to the noise can be prevented from being output externally.

The memory device according to the present invention may be formed on a single semiconductor substrate or a plurality of semiconductor substrates.

I claim:

1. A static semiconductor memory device, operatively connected to receive an input address signal, including word lines and bit lines intersecting the word lines, comprising:
   a memory cell array including a large number of static memory cells, operatively connected at the intersections of the word lines and bit lines and arranged in a matrix fashion, for storing and reading out data;
   a word decoder, operatively connected to said memory cell array, for selecting one of the word lines by decoding the input address signal;
   a column decoder, operatively connected to said memory cell array, for selecting one of the bit lines by decoding the input address signal;
   a data buffer, operatively connected to said memory cell array, for storing the data read out from said memory cell array;
   an address delay buffer, operatively connected to receive the input address signal, for delaying said input address signal by a predetermined delay time, said predetermined delay time corresponding to the operation time of said word decoder, said column decoder and said memory cell array; and
   a comparator circuit, operatively connected between said address delay buffer and said data buffer, for receiving and comparing said input address signal with said delayed address signal from said address delay buffer, and for generating an inequality signal when said input address signal has a logic level different from the logic level of said delayed address signal;
   said data buffer including means for inhibiting said data buffer from receiving the data read out from said memory cell array when said inequality signal from said comparator circuit is applied thereto, said data buffer continuing to output data corresponding to the data output immediately before said inequality signal is generated when said means for inhibiting said data buffer inhibits said data buffer from receiving data from said memory cell array, said data buffer outputting data corresponding to data output concurrently from said memory cell array when said means for inhibiting said data buffer does not inhibit said data buffer from receiving the data output from said memory cell array.

2. A static semiconductor memory device as defined in claim 1, wherein said memory device is formed on one semiconductor substrate.

3. A static semiconductor memory device as defined in claim 1, wherein said memory device is formed on more than one semiconductor substrate.

* * * * *